United States Patent
Dieny et al.

(10) Patent No.: US 8,767,453 B2
(45) Date of Patent: Jul. 1, 2014

(54) MAGNETIC DEVICE WITH EXCHANGE BIAS

(75) Inventors: Bernard Dieny, Lans en Vercors (FR); Jérôme Moritz, Saint Pierre de Bressieux (FR)

(73) Assignee: Commissariat a l'energie atomique et aux energies alternatives, Paris (FR)

(*) Notice: Subject to any disclaimer, the term of this patent is extended or adjusted under 35 U.S.C. 154(b) by 65 days.

(21) Appl. No.: 13/489,944

(22) Filed: Jun. 6, 2012

(65) Prior Publication Data

US 2012/0307556 A1 Dec. 6, 2012

(30) Foreign Application Priority Data

Jun. 6, 2011 (FR) ...................................... 11 54899

(51) Int. Cl.
G11C 11/14 (2006.01)
G11C 11/16 (2006.01)

(52) U.S. Cl.
CPC ...................................... *G11C 11/16* (2013.01)
USPC ............. 365/171; 365/158; 365/97; 365/145; 365/74; 365/50

(58) Field of Classification Search
CPC ................................ G11C 11/16; G11C 11/15
USPC .................. 365/171, 145, 50, 32, 33, 97, 109
See application file for complete search history.

(56) References Cited

U.S. PATENT DOCUMENTS

2010/0090300 A1 4/2010 Xi et al.
2012/0087185 A1* 4/2012 Zhou et al. .................... 365/171

FOREIGN PATENT DOCUMENTS

FR 2 817 999 6/2002
FR 2 924 851 6/2009

OTHER PUBLICATIONS

Umebayashi, H., et al., "Antiferromagnetism of γFe-Mn Alloys," Journal of the Physical Society of Japan, vol. 21, No. 7, Jul. 1966, pp. 1281-1294.
Jungblut, R., et al., "Orientational dependence of the exchange biasing in molecularbeam epitaxygrown Ni80Fe20/Fe50Mn50 bilayers (invited)," Journal of Applied Physics, vol. 75 (10), May 15, 1994, pp. 6659-6664.
Tomeno, I., "Magnetic neutron scattering study of ordered Mn3Ir," Journal of Applied Physics, vol. 86, No. 7, Oct. 1, 1999, pp. 3853-3856.
Devasahayam, A.J., et al., "Magnetic, temperature, and corrosion properties of the NiFe/IrMn exchange couple," Journal of Applied Physics, vol. 83, No. 11, Jun. 1, 1998, pp. 7216-7218.

(Continued)

*Primary Examiner* — Thong Q Le
(74) *Attorney, Agent, or Firm* — Pillsbury Winthrop Shaw Pittman LLP (57) ABSTRACT

A magnetic device includes a magnetic layer having a variable direction of magnetization, and a first antiferromagnetic layer in contact with the magnetic layer, the first antiferromagnetic layer being able to trap the direction of magnetization of the magnetic layer. The magnetic device also includes a layer made of a ferromagnetic material in contact with the first antiferromagnetic layer through its face opposite to the magnetic layer, the directions of magnetization of the magnetic and ferromagnetic layers being substantially perpendicular. A first layer among the magnetic and ferromagnetic layers has a magnetization, the direction of which is oriented in the plane of the first layer whereas the second of the two layers among the magnetic and ferromagnetic layers has a magnetization, the direction of which is oriented outside of the plane of the second layer.

11 Claims, 3 Drawing Sheets

(56) References Cited

OTHER PUBLICATIONS

Takano, K., et al., "Role of interfacial uncompensated antiferromagnetic spins in unidirectional anisotropy in Ni81Fe19/CoO bilayers (invited)," Journal of Applied Physics, vol. 83, No. 11, Jun. 1, 1998, pp. 6888-6892.

Search Report and Written Opinion as issued for French Patent Application No. 1154899, dated Dec. 5, 2011.

* cited by examiner

MAGNETIC DEVICE WITH EXCHANGE BIAS

CROSS-REFERENCE TO RELATED APPLICATIONS

The present application claims priority and benefit to French Patent Application No. 1154899, filed Jun. 6, 2011, the content of which is incorporated herein in its entirety by reference.

FIELD

The present invention relates to the field of magnetic materials and more particularly relates to a magnetic device with exchange bias between a ferromagnetic material and an antiferromagnetic material. The device according to the invention is particularly intended to be implemented in magnetic memories with thermally assisted writing, in magnetic field sensors or in reading heads for magnetic recording support, etc.

The invention finds a particularly interesting application in the formation of memory cells and MRAM (magnetic random access memory or magnetic direct access memory) type memory with thermally assisted writing.

BACKGROUND

MRAM magnetic memories have experienced a resurge of interest with the development of magnetic junction tunnels having strong magnetoresistance at ambient temperature. MRAM memories comprise several memory cells. Said memory cells are generally magnetic devices that comprise:
- a magnetic layer known as "reference layer" that has a magnetisation, the direction of which is fixed;
- a magnetic layer known as "storage layer" that has a magnetisation, the direction of which is variable and which can orient itself either parallel or antiparallel to the direction of magnetisation of the reference layer;
- a spacer made of an insulating or semi-conductor material that separates the reference layer and the storage layer.

The document FR2817999 describes for example such a magnetic device. Said magnetic device has two modes of operation: a "reading" mode and a "writing" mode. In writing mode, a flow of electrons or a magnetic field is sent through the layers so as to cause the reversal of the direction of magnetisation of the storage layer, which then becomes parallel or antiparallel to the direction of magnetisation of the reference layer. Depending on whether the direction of magnetisation of the storage layer is parallel or antiparallel to the direction of magnetisation of the reference layer, a "1" or a "0" is stored in the storage layer.

In reading mode, a flow of electrons is injected through the magnetic device so as to read its resistance. When the directions of magnetisation of the reference layer and of the storage layer are parallel, the resistance of the junction is low, whereas when the directions of magnetisation of the reference and storage layers are antiparallel, the resistance of the junction is high. By comparison with a reference resistance, the value stored in the storage layer ("0" or "1") may be determined.

The document FR2924851 furthermore proposes adding to the device described previously an antiferromagnetic layer in contact with the storage layer. In reading mode, said antiferromagnetic layer makes it possible to fix the direction of magnetisation of the storage layer so that the information stored in the storage layer does not vary. In writing mode on the other hand, the antiferromagnetic layer is heated so that it becomes paramagnetic or at least that the temperature thereof exceeds the temperature known as blocking temperature of the antiferromagnetic layer. This phenomenon, known as exchange bias, is based on the following principle: when a ferromagnetic material is put in contact with an antiferromagnetic material, there may be appearance of unidirectional anisotropy: the hysteresis loop of the ferromagnetic material then has a field shift as if a constant field was superimposed on the exterior field applied; said constant field results from the exchange interaction through the interface with the antiferromagnetic material.

The blocking temperature is in general below the Néel temperature of the antiferromagnetic material but it approaches more and more the Néel temperature as the duration of the heating is reduced towards times of the order of several nanoseconds. The Néel temperature of the antiferromagnetic material is the temperature at which antiferromagnetic order disappears and above which the material behaves like a paramagnetic material. When the temperature of the antiferromagnetic layer exceeds the blocking temperature, the direction of magnetisation of the storage layer may then be modified since it is no longer trapped by the antiferromagnetic layer. Once the direction of magnetisation of the storage layer has been modified, the heating of the antiferromagnetic layer is stopped. The antiferromagnetic layer then again becomes antiferromagnetic. The direction of magnetisation of the storage layer is then trapped in the direction in which it was found at the end of the writing process. Magnetic devices that comprise such an antiferromagnetic layer and implement a temporary heating of said layer at the time of writing of the information are part of devices known as "thermally assisted writing" devices.

Magnetic devices with thermally assisted writing are advantageous because they make it possible to reduce the risk of accidental writing during the reading of the information contained in the storage layer. Furthermore, they have much better retention than devices not implementing thermal assistance, in other words they have a better capacity to preserve written information over time.

Nevertheless, in these thermally assisted writing devices, an important density of structural defects is observed due to the structural incompatibility between the antiferromagnetic layer, which generally has a centred-face cubic crystallographic structure, and the storage layer, which generally has a centred cubic crystallographic structure when it is in contact with an MgO tunnel barrier. Said structural defects have a direct impact on the trapping quality of the storage layer by the antiferromagnetic layer.

To overcome these drawbacks, the document FR2924851 proposes adding in the storage layer an amorphous or quasi-amorphous layer, for example made of tantalum, as well as a ferromagnetic layer with centred-face cubic crystallographic structure, for example made of permalloy NiFe. The addition of said layers makes it possible to make a structural transition between the antiferromagnetic layer and the layers that have a centred cubic crystallographic structure.

However, magnetic devices with thermally assisted writing of the prior art have numerous drawbacks when the thickness of the antiferromagnetic layer or the lateral size of said devices is reduced.

Thus, as mentioned previously, the antiferromagnetic layers used in the thermally assisted writing devices to trap the storage layers crystallise in the cubic network with centred faces (case of the compounds FeMn and IrMn). The growth of said materials generally takes place along the axis [111] of the dense planes, growth axis all the more pronounced when the buffer layers follow the same axis, which is the case of NiFe for example, and more generally of alloys based on Co formed by cathodic sputtering. In the planes (111), the magnetic moments composing the antiferromagnetic network are oriented so that the resulting total moment is zero: these compounds are known as antiferromagnetic materials with compensated moments (see J. Phys. Soc. Jpn 21, 1281 (1966) and J. Appl. Phys. 75, 6659 (1994) for the compound FeMn and J. Appl. Phys. 86, 3853 (1999) for IrMn).

Figure 1:
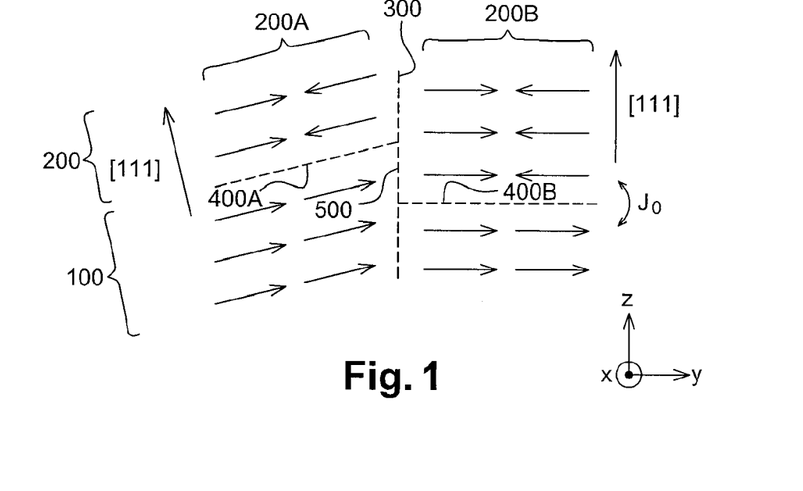
FIG. 1 schematically represents a sectional view of the interface between a ferromagnetic layer and a granular antiferromagnetic layer according to the prior art.

This set of non-compensated moments should theoretically lead to an absence of exchange bias between the ferromagnetic layer and the antiferromagnetic layer but there exists in the polycrystalline antiferromagnetic layers, as mentioned above, a mozaicity which results in a distribution of the axes [111] around the z axis perpendicular to the plane of the layers, as shown in FIG. 1, which schematically represents a sectional view of the interface between a ferromagnetic layer 100 and a granular antiferromagnetic layer 200 composed of a plurality of grains (here two grains 200A and 200B are represented separated by a grain joint 300). Inside each antiferromagnetic grain, where the growth is coherent, the directions of magnetisation of the antiferromagnetic layer 200 thus form a completely compensated network oriented on average parallel to the interfaces 400A and 400B between the ferromagnetic layer 100 and the antiferromagnetic layer 200, but distributed over the whole of the layer due to the distributions of the growth axes [111]. Thus, the exchange bias between the ferromagnetic layer 100 and the antiferromagnetic layer 200 takes place essentially via the magnetic moments (designated equally well hereafter magnetisation vectors or magnetisations) non-compensated at the interface, that are found at the grain joints for example, or at the level of the atomic steps (cf. the atomic step 500 between the interfaces 400A and 400B) composing the interfacial rugosity, since everywhere else (where the growth of the first antiferromagnetic layer is coherent), the antiferromagnetic interfacial moments have a zero outcome and induce little or even no bias on average with the ferromagnetic layer 100.

Moreover, the antiferromagnetic moments orient themselves preferentially along certain easy axes, said anisotropy being characterised by the constant anisotropy noted KAF of the antiferromagnetic layer expressed in erg/cm3.

If a single antiferromagnetic grain is considered, having a cylindrical geometry, the thickness is $t_{AF}$ and the surface area is S, in order to observe a shift of the hysteresis loop of the ferromagnetic layer in contact with said grain, it is necessary that $K_{AF} \times S \times t_{AF} > J_0 \times S$ (1) where J0 represents the energy of interaction at the interface between the ferromagnetic layer and the antiferromagnetic layer expressed in erg/cm². This inequality (1) means that the antiferromagnetic moments of the grain Must not follow the ferromagnetic moments during the rotation thereof to contribute to the exchange anisotropy. Consequently, with a view to miniaturisation capable of inducing a reduction in the thicknesses of the devices, it may be observed that the bias effect is no longer observed below a critical thickness. In addition, it is known that the blocking temperature of antiferromagnetic layers diminishes with the thickness thereof, and that it is necessary to attain this blocking temperature to modify the direction of magnetisation of the ferromagnetic storage layer (J. Appl. Phys. 83, 7216 (1998)). Said reduction in the blocking temperature (enabling energy savings during writing phases) is thus limited by the existence of said critical thickness below which the bias effect is no longer observed. The fact of reducing the thicknesses of antiferromagnetic material, the cost of which is high, makes it possible moreover to make production savings.

Figure 2:
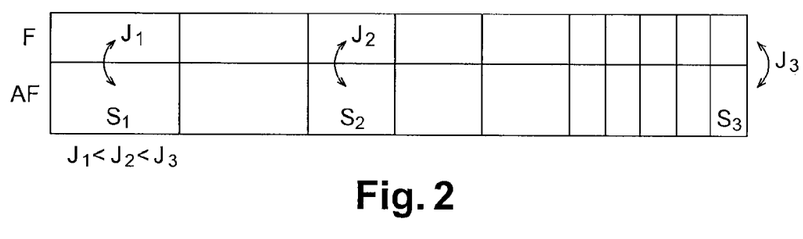
FIG. 2 schematically represents a plurality of grains of different size in a structure comprising an antiferromagnetic layer and a ferromagnetic layer according to the prior art.

Furthermore, in a granular polycrystalline antiferromagnetic layer, the size of the grains is widely distributed. For purely illustrative purposes, FIG. 2 schematically represents a plurality of grains of different size in a structure comprising an antiferromagnetic layer AF and a ferromagnetic layer F. In this figure, three grains having decreasing surfaces from S1 to S3 are illustrated. In accordance with the inequality (1) presented in the preceding paragraph, it is considered that only the largest grains contribute to the exchange field. It is known that the energy of interaction is dependent on the surface area of the grains: the larger said surface area, the lower the energy of interaction, and vice versa (J. Appl. Phys. 83, 6888 (1998)). Thus, in the case of FIG. 2, exchange energies J1 to J3 corresponding to the surfaces S1 to S3 are less and less high such that the effect of the exchange anisotropy of the smallest grains is less important.

When the size of the thermally assisted writing devices of the prior art is reduced, the stability of the antiferromagnetic layer is reduced, as is the trapping of the storage layer by the antiferromagnetic layer. In fact, the antiferromagnetic layer has a polycrystalline granular structure and the grains constituting the layer are weakly magnetically coupled together. Yet, when the size of the magnetic device is reduced, the proportion of the grains of the antiferromagnetic layer that are situated at the periphery of the antiferromagnetic layer is increased. In addition, said peripheral grains are in part eaten away by the etching process, which has the effect of making their magnetisation less stable. They may even be qualified as magnetically unstable when the eaten away part exceeds a certain percentage of the eaten away part of the initial surface of the grain. As the size of the device is reduced, the size distribution of the grains constituting the antiferromagnetic layer tends to widen. This results in very important fluctuations of trapping properties from one device to the next, and in the example of magnetic memories from one memory point to the next. Thus, when devices of the prior art of small dimensions are etched, the volume of said peripheral grains is reduced, which leads to a reduction in the magnetic coherence of the antiferromagnetic layer linked in particular to the presence of small grains. Said reduction in the magnetic coherence of the antiferromagnetic layer brings about a more or less significant reduction in the trapping quality of the storage layer by the antiferromagnetic layer and an increase in the dispersion of the trapping properties from one point to the next.

SUMMARY

The invention aims to overcome the drawbacks of the prior art by proposing a magnetic device with increased exchange bias for a given thickness of antiferromagnetic layer, said device making it possible to reduce the critical thickness from which the exchange bias is observed and bringing about savings both in terms of production as in terms of energy consumption during the phase of writing of the magnetisation of the ferromagnetic layer via obtaining a reduced blocking temperature.

To do this, the invention proposes a magnetic device comprising:
 a magnetic layer, known as free layer, having a variable direction of magnetisation;
 a first antiferromagnetic layer in contact with said free layer, said first antiferromagnetic layer being able to trap the direction of magnetisation of said free layer; the magnetic device being characterised in that it moreover comprises a layer made of a ferromagnetic material, known as stabilisation layer, said stabilisation layer being in contact with said first antiferromagnetic layer by the face thereof opposite to said free layer, the directions of magnetisation of said free and stabilisation layers being substantially perpendicular, a first layer among said free and stabilisation layers having a magnetisation, the direction of which is oriented along the plane of said first layer whereas the second of the two layers among said free and stabilisation layers has a magnetisation, the direction of which is oriented outside of the plane of said second layer.

In the case of growth known as columnar growth (characteristic of stacks of magnetic layers, the deposition of which is often carried out by cathodic sputtering), the grains of the different layers align themselves from bottom to top. Consequently, substantially perpendicular directions of magnetisation is taken to mean perpendicular magnetisations between each of the two aligned grains belonging respectively to the stabilisation layer and to the free layer (i.e. situated one above or one below the other) and separated from each other by a grain of the antiferromagnetic layer.

According to the invention, a stabilisation layer is added made of ferromagnetic material in contact with the antiferromagnetic trapping layer on the side opposite to that of the ferromagnetic free layer (typically the storage layer in the case of a MRAM memory). The stabilisation layer has a uniaxial magnetic anisotropy such that the magnetisation thereof remains orthogonal to the magnetisation of the free layer, whatever the step of using the device (i.e. during all of the writing and reading processes). The free layer and the stabilisation layer exert reciprocal interactions, propagated step by step by the antiferromagnetic network: said interactions are greater the lower the thickness of the antiferromagnetic layer (typically less than 5 nm). In this situation, the stabilisation layer exerts at the first interface with the antiferromagnetic layer an exchange interaction that has for effect a tilt of the directions of magnetisation of the antiferromagnetic layer compared to their anisotropy axes. "Tilt" is taken to mean a disorientation of the magnetic moments from their anisotropy axis or their initial position. In the thickness of the antiferromagnetic layer, said tilt propagates in the network via exchange interactions up to the free layer. At the interface with the free layer, the tilt of the directions of magnetisation of the antiferromagnetic layer induced makes it possible to reduce, by a positive J0 value, the energy of interaction J0 at the interface between the free layer and the antiferromagnetic layer. Said effect is all the greater when the thickness of the antiferromagnetic layer is sufficiently low so that the directions of magnetisation of the antiferromagnetic layer do not relax towards their anisotropy axes: in other words, it is advantageously advisable to choose the thickness of the antiferromagnetic layer such that the effect of tilting of the directions of magnetisation with respect to the magnetic anisotropy axis of the antiferromagnetic layer caused by the stabilisation layer propagates up to the interface of the antiferromagnetic layer with the free layer.

The antiferromagnetic trapping layers are particularly used to trap the magnetisation of the free layers having a magnetisation in the plane of the layer. In this case, the stabilisation layer has an out of plane direction of magnetisation. Thus, the addition of a stabilisation layer with anisotropy orthogonal to the free layer makes it possible to reduce the exchange interaction with the antiferromagnetic layer by $\Delta J_0$. It is important to note that the reasoning developed in the present invention also applies to antiferromagnetic materials with non-compensated magnetic moments along the growth planes of the antiferromagnetic layer. A reduction of $J_0$ makes it possible to reduce the critical thickness from which a shift of the hysteresis loop of the free ferromagnetic layer is observed. The reduction in the critical thickness from which a shift of the hysteresis loop appears is indirectly an advantage for the writing of the free layer. In fact, it is known that the blocking temperature of antiferromagnetic layers diminishes with the thickness thereof, and that it is necessary to attain said blocking temperature to write the free layer (J. Appl. Phys. 83, 7216 (1998)). The stabilisation layer within the scope of this embodiment thus enables the use of a thinner antiferromagnetic layer, writeable at lower temperatures, consequently bringing about energy savings during the writing phases.

The stabilisation layer moreover makes it possible to increase the magnetic cohesion of the antiferromagnetic layer by increasing the effective bias between the grains constituting the antiferromagnetic layer. The presence of said stabilisation layer made of ferromagnetic material makes it possible to reinforce the bias from grains to grains within the antiferromagnetic layer. In fact, when the layer made of antiferromagnetic material is alone, the grains that constitute it are very weakly coupled together. Quite the reverse, in a layer made of ferromagnetic material, the grains are very strongly coupled together. When a ferromagnetic layer and an antiferromagnetic layer are placed in contact, the magnetisation of the grains of the ferromagnetic layer has a tendency to align itself with the final plane of interfacial spins of the grains of the layer made of antiferromagnetic material. It ensures therefrom that each grain of the ferromagnetic stabilisation layer is strongly coupled magnetically with the grain of the antiferromagnetic layer with which it is in contact. Moreover, the grains of the stabilisation layer made of ferromagnetic material are very strongly coupled together, such that the grains of the first antiferromagnetic layer also become coupled together, through the intermediary of the grains of the ferromagnetic layer. The stabilisation layer thus makes it possible to increase the magnetic cohesion of the antiferromagnetic layer by inducing in an indirect manner a coupling between grains within the antiferromagnetic layer. Thus in a device of highly submicronic lateral dimensions, the grains situated at the periphery of the device, which were initially unstable, are stabilised by this indirect intergrain coupling. It ensues from this that said stabilisation layer makes it possible to increase the exchange bias between the antiferromagnetic layer and the storage layer. Thus, outside of a writing event, in other words as long as the antiferromagnetic layer is not heated above its blocking temperature, the trapping of the free layer by the adjacent antiferromagnetic layer remains efficient even for devices with highly submicronic lateral dimensions.

The magnetic device according to the invention may also have one or more of the following characteristics, considered individually or in any technical possible combinations thereof.

said stabilisation layer has a direction of magnetisation oriented outside of the plane of said stabilisation layer and said free layer has a direction of magnetisation in the plane of said free layer;

said stabilisation layer is formed according to one of the following lay outs or materials:

a multilayer of period (Pt/Co), (Pd/Co), (Co/Ni) or (Co/Pt/Cr/X), X being Ta or P;

an ordered alloy of FePt or FePd;

an alloy of CoPt or CoPd;

a rare earth/transition metal alloy;

the thickness of said first antiferromagnetic layer is comprised between 3 and 5 nm;

said free layer comprises at least one stack formed of:

a transition layer constituted of a ferromagnetic material having a centred-face cubic crystallographic structure in contact with the first antiferromagnetic layer;
an amorphous or quasi-amorphous layer in contact with said transition layer;
a ferromagnetic layer;
    said free layer is constituted of a synthetic three layer antiferromagnetic stack comprising a first and a second magnetic layer separated by a non-magnetic conducting layer;
    the device according to the invention has a shape anisotropy in the plane thereof;
    the device according to the invention is a magnetic device with thermally assisted writing comprising:
a magnetic layer known as "reference layer", said free layer being a storage layer;
a spacer situated between said reference layer and said storage layer;
    said reference layer has a direction of magnetisation trapped by a second antiferromagnetic layer laid out in contact with the reference layer;
    the reference layer has a variable direction of magnetisation.

The invention also relates to a magnetic memory with thermally assisted writing in which each memory point comprises a magnetic device according to the invention.

BRIEF DESCRIPTION OF THE DRAWINGS

Other characteristics and advantages of the invention will become clearer on reading the description that follows, with reference to the appended figures.

DETAILED DESCRIPTION

For more clarity, identical or similar components are marked by identical reference signs in all of the figures.

In all of the figures, the arrows that bear the reference "D" represent the direction of magnetisation of the layer on which they are situated. The arrows noted "I" represent flows of electrons.

FIGS. 1 and 2 have already been described with reference to the prior art.

Figure 3:
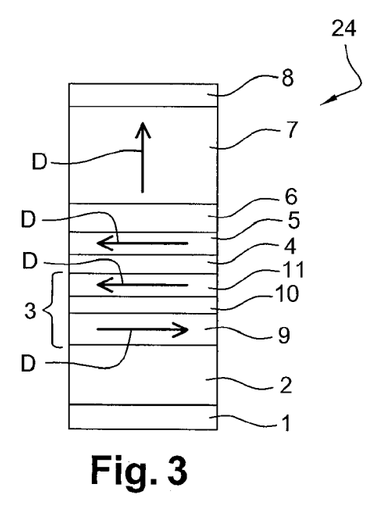
FIG. 3 represents a sectional view of a magnetic device according to a first embodiment of the invention.
Figure 4:
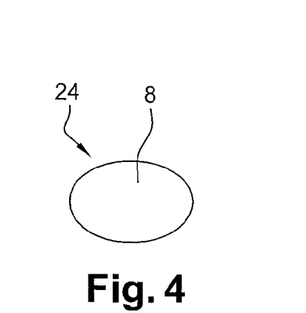
FIG. 4 represents a top view of the magnetic device of FIG. 3.

FIGS. 3 and 4 represent a magnetic device 24 according to an embodiment of the invention. Said magnetic device 24 comprises a buffer layer 1 which serves as base to the growth of the other layers of the magnetic device. Said buffer layer 1 is preferably made of a non-magnetic material. It may for example be made of a nickel-iron-chromium alloy containing at least 20% Cr, or copper nitride or have a multilayer structure constituted of an alternation of layers of copper, and layers of tantalum. Obviously, said materials are only given for illustrative purposes, without restricting the invention.

The magnetic device 24 also comprises a cover layer 8 that protects the stack of layers of the magnetic device from oxidation or makes it possible if necessary to ensure the electrical connection of the stack with the upper electrode of the stack. Said cover layer 8 may for example be constituted of tantalum, of copper nitride or have a multilayer structure constituted of an alternation of copper layers and tantalum layers.

Between the buffer layer 1 and the cover layer 8, the magnetic device then comprises a second antiferromagnetic layer 2 that is arranged against the buffer layer 1. Said second antiferromagnetic layer 2 may be for example made of PtMn of thickness comprised between 12 and 30 nm or NiMn of thickness comprised between 20 nm and 50 nm. The second antiferromagnetic layer 2 is preferably made of an antiferromagnetic material that has a high Néel temperature, typically greater than or equal to 350° C. The materials cited above for the antiferromagnetic layer 2 are only given as an illustration and other materials could be used without going beyond the scope of the invention.

The magnetic device then comprises a reference layer 3 in contact with the second antiferromagnetic layer 2. The reference layer 3 may be a monolayer, or it may be constituted of a stack of layers, and particularly it may be constituted of a synthetic three layer antiferromagnetic stack as represented in FIG. 3. The synthetic three layer antiferromagnetic stack represented in FIG. 3 is constituted of two magnetic layers 9 and 11 separated by a non-magnetic conducting layer 10 able to induce an antiparallel alignment between the magnetisations of the adjacent magnetic layers. The magnetic layer 9 may for example be constituted of a cobalt-iron alloy, whereas the magnetic layer 11 may be constituted of a cobalt-iron-boron alloy, or vice versa. It is also possible to make the two magnetic layers 9 and 11 of the same magnetic alloy. Each magnetic layer 9 and 11 has preferably a thickness comprised between 1 and 4 nm. The two magnetic layers 9 and 11 have preferably similar thicknesses, so that the field radiated by the set of two magnetic layers 9 and 11 at the level of the storage layer 5 is as low as possible. The non-magnetic conducting layer 10 may for example be made of ruthenium of thickness between 0.5 nm and 0.9 nm, thicknesses, for which it is known that ruthenium induces an antiparallel bias between magnetisations of adjacent magnetic layers. The two magnetic layers 9 and 11 are coupled in an antiparallel manner through the non-magnetic conducting layer 10. The direction of magnetisation of the two magnetic layers 9 and 11 is fixed by the second antiferromagnetic layer 2, as long as the magnetic device is at a temperature below the Néel temperature of the antiferromagnetic material that constitutes the second antiferromagnetic layer 2. The constituent materials of the reference layer are well known to those skilled in the art and are only given here as an indication, without nevertheless restricting the invention.

The reference layer 3 has a direction of magnetisation in the plane of the reference layer.

The magnetic device then comprises a free storage layer 5 separated from the reference layer 3 by a spacer 4. The spacer 4 may be a tunnel barrier selected from a group comprising oxides of aluminium $AlO_x$, titanium $TiO_x$ and magnesium oxide MgO. Alternatively, the spacer 4 may be constituted of a semiconductor. Thus, the spacer may be constituted of silicon, germanium or GaAs. The spacer 4 may also be made of a heterogeneous metal/oxide layer such as a layer with confined current paths constituted of an insulating barrier for example made of alumina of 2 nm thickness pierced by conducting channels which are for example made of copper of nanometric diameter, typically between 1 and 4 nm. The spacer 4 has preferably a thickness comprised between 0.6 nm and 5 nm.

The storage layer 5 is a magnetic free layer that has a variable direction of magnetisation in the plane of the free layer. Said storage layer 5 may be a monomagnetic layer or a stack of layers. The storage layer 5 may for example be constituted of a stack of layers comprising:
a transition layer constituted of a ferromagnetic material having a centred-face cubic crystallographic structure in contact with the first antiferromagnetic layer;
an amorphous or quasi-amorphous layer in contact with the transition layer;
a ferromagnetic storage layer of centred cubic crystallographic structure.

This type of storage layer is particularly interesting in the case where the spacer 4 is a tunnel barrier based on MgO, the crystallographic structure of which is centred cubic.

The storage layer 5 may also be constituted of a synthetic three layer antiferromagnetic stack comprising a first and a second magnetic layer separated by a non-magnetic conducting layer.

In the example of FIG. 3, the storage layer 5 is constituted of a monolayer. Said monolayer may for example be constituted of cobalt or a cobalt-iron-boron alloy. The storage layer has preferably a thickness comprised between 1 and 7 nm.

The storage layer 5 has a direction of magnetisation in the plane of the storage layer, said direction being variable and which can be parallel or antiparallel to the direction of magnetisation of the reference layer 3.

Obviously, the characteristics of the storage layer are only given here as an indication, and those skilled in the art will know how to adapt the invention to other types of storage layers.

The magnetic device then comprises, in contact with the storage layer 5, a first synthetic antiferromagnetic layer 6 which makes it possible to trap the direction of magnetisation of the storage layer 5 during reading, and which enables the freeing of the direction of magnetisation of the storage layer 5 during writing. The first antiferromagnetic layer 6 may for example be made of IrMn (for example an $Ir_{20}Mn_{80}$ alloy) of thickness comprised between 3 and 5 nm.

The magnetic device moreover comprises, in contact with the first antiferromagnetic layer 6, a stabilisation layer 7 made of a ferromagnetic material. Said stabilisation layer 7 has a strong uniaxial anisotropy out of the plane of the stabilisation layer 7 and orthogonal to the direction of magnetisation of the storage layer 5. The stabilisation layer 7 may for example be produced in the form of a multilayer of the platinum/cobalt type (a layer of platinum and a layer of cobalt superimposed) of general form (Pt/Co)m where m corresponds to the number of repetitions of the Pt/Co units, for example $(Pt_{1.8mm}/Co_{0.6mm})_3$.

Other materials may be used for the stabilisation layer. They may be for example CoPtCr alloy or CoPtCrX alloy, X being Ta or P. Multilayers of cobalt/palladium of general form (Co/Pd)n or cobalt/nickel of general form (Co/Ni)p may also be used, n and p corresponding respectively to the numbers of repetitions of the units Co/Pd and Co/Ni. Any type of ferromagnetic material with high anisotropy perpendicular to the plane may also be used, for example alloys such as CoPt or CoPd, chemically ordered alloys such as FePt or FePd or certain rare earth/transition metal alloys such as TbCo, which also have out of plane anisotropies.

The magnetic device 24 has preferably an elliptical section, as it may be seen more precisely in FIG. 4, or at least a shape anisotropy in the plane thereof.

As will be seen hereafter, the stabilisation layer 7 enables the reduction in the critical thickness of the antiferromagnetic layer 6 from which appears a shift of the hysteresis loop of the free layer 5.

This phenomenon will be explained in greater detail with reference to FIG. 5 which schematically represents, at the microscopic level, the storage layer 5, the first antiferromagnetic layer 6 and the stabilisation layer 7. Each of these layers is constituted of grains (here two grains per layer are represented), respectively 5a and 5b, 6a and 6b and 7a and 7b. Each grain 5a, 5b, 6a, 6b, 7a and 7b is a monocrystalline domain that has substantially the same crystallographic orientation.

In the case of growth known as columnar growth (characteristic of stacks of magnetic layers according to the invention, the deposition of which is often carried out by cathodic sputtering), the grains of the different layers align themselves from bottom to top: thus, the grains 5a, 6a and 7a are aligned from bottom to top; in the same way, the grains 5b, 6b and 7b are aligned from bottom to top.

Within a same layer, for example within the first antiferromagnetic layer 6, two adjacent grains 6a and 6b, are separated by a grain joint 6c. The same is true for the grain joints 5c and 7c separating respectively the joints 5a and 5b and the joints 7a and 7b. The grain joints 5c, 6c and 7c are thus zones in which one passes from one crystallographic orientation to another crystallographic orientation.

The growth of the layers 5, 6 and 7 generally takes place along the axis [111].

Within each of the grains 5a and 5b of the free layer 5, the directions D5 of magnetisation are all parallel with each other, in the same sense and in the plane of the free layer 5.

Within each of the grains 7a and 7b of the stabilisation layer 7, the directions D7 of magnetisation are all parallel to each other, in the same sense, outside of the plane of the stabilisation layer 7. Moreover, the magnetisations D7 of the grain 7a are perpendicular to the magnetisations D5 of the grain 5a. In the same way, the magnetisations D7 of the grain 7b are perpendicular to the magnetisations D5 of the grain 5b. More generally, the magnetisations are perpendicular between each of the two aligned grains belonging respectively to the stabilisation layer 7 and to the free layer 5 and separated from each other by a grain of the antiferromagnetic layer 6.

As evoked with reference to FIG. 1, in the absence of stabilisation layer, the magnetisations (represented by dotted lines) of the antiferromagnetic layer 6 would orient themselves along an easy axis of anisotropy perpendicular to the axis [111], said anisotropy being characterised by a constant anisotropy noted $K_{AF}$.

When the thickness of the antiferromagnetic layer 6 is sufficiently low (typically less than 5 nm), the storage layer (free layer) 5 and the stabilisation layer 7 exert reciprocal interactions, propagated step by step by the antiferromagnetic network. In this situation, the stabilisation layer 7 exerts at the first interface (interfaces 67a and 67b respectively between the grains 7a and 6a and the grains 7b and 6b) with the antiferromagnetic layer 6 an exchange interaction that has for effect a tilt of the antiferromagnetic moments with respect to the axes of anisotropy thereof. Said tilt manifests itself by a tilting of the directions of magnetisations D6 of the antiferromagnetic layer with respect to their easy axes of anisotropy in dotted lines. In the thickness of the antiferromagnetic layer 6, said tilt propagates in the network via exchange interactions up to the storage layer 5. At the interface of the antiferromagnetic layer 6 (interfaces 56a and 56b respectively between the grains 5a and 6a and the grains 5b and 6b and atomic step 56c between the interfaces 56a and 56b) with the storage layer 5, the tilt of the antiferromagnetic moments induced makes it possible to reduce by a positive $\Delta J_0$ value the energy of interaction $J_0$ (also known as exchange energy surface density). This effect is all the more efficient when the thickness of the antiferromagnetic layer 6 is sufficiently low so that the antiferromagnetic moments do not relax towards the axes of anisotropy thereof. Thus the addition of a stabilisation layer 7 with magnetisation out of the plane thereof and with anisotropy orthogonal to the free layer 5 makes it possible to reduce the exchange interaction with the antiferromagnetic layer by $\Delta J_0$. It is important to note that the reasoning developed in the present invention also applies to non-compensated antiferromagnetic materials (i.e. case of an interface between the free layer and the antiferromagnetic layer having a net non-zero magnetisation) along the growth planes of the antiferromagnetic layer.

By applying the inequality (1) given in the introduction, it will be easily understood that the thickness tAF of the antiferromagnetic layer may be chosen thinner than in the absence of the stabilisation layer 7 while continuing to observe a shift of the hysteresis loop of the ferromagnetic free layer 5, the inequality (1) becoming: $K_{AF} \times S \times t_{AF} > (J_0 - \Delta J_0) \times S$ if a single antiferromagnetic grain having a cylindrical geometry is considered, the thickness of which is $t_{AF}$ and the surface area is S. Said inequality signifies that the antiferromagnetic moments of the grain must not follow the ferromagnetic moments during the rotation thereof to contribute to the exchange bias. In this simple model, it may be seen that a reduction of $J_0$ makes it possible to reduce the critical thickness $t_{AFCri}$ from which the inequality is verified. In the presence of a shift of the hysteresis loop, the free layer behaves as if there was an additional internal and unidirectional effective field: the exchange bias field $H_{ex}$.

Figure 6:
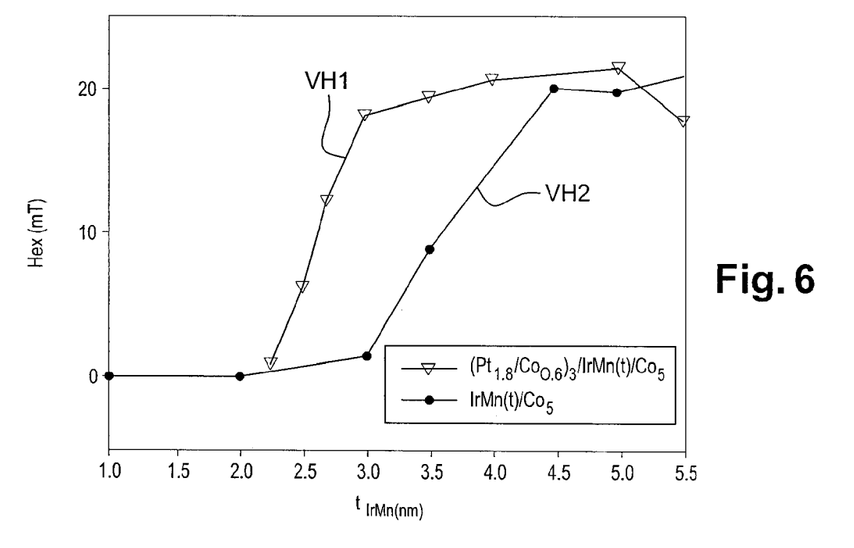
FIG. 6 illustrates the variations in the exchange field with or without the stabilisation layer of the device according to the invention.

FIG. 6 represents the variations VH1 and VH2 in the exchange bias fields $H_{ex}$ measured on the free layer with (curve VH1) and without (curve VH2) stabilisation layer as a function of the thickness of the antiferromagnetic layer. It will be noted that the addition of the stabilisation layer on the second interface of the antiferromagnetic layer makes it possible to reduce notably the critical thickness at which the exchange bias appears. For example, for an antiferromagnetic thickness of 3 nm, the exchange field measured on the storage layer without stabilisation layer is 1.33 mT, whereas it is 18 mT when the stabilisation layer is present, i.e. a tenfold improvement. Within the scope of this experimental demonstration, the storage layer was composed of Co of 5 nm thickness with planar magnetisation, the stabilisation layer was a multilayer $(Pt_{1.8nm}/Co_{0.6nm})_3$, which has a strong uniaxial anisotropy perpendicular to the plane, and thus to the magnetisation of the storage layer, and the antiferromagnetic layer was constituted of an $Ir_{20}Mn_{80}$ alloy of variable thickness. Moreover, the presence of an exchange bias field $H_{ex}$ is observed from a critical thickness of 2.25 nm in the presence of the stabilisation layer whereas said exchange bias field appears from a critical thickness of 3 nm in the absence of stabilisation layer.

The reduction in the critical thickness from which a shift of the hysteresis loop appears is indirectly an advantage for the writing of the free layer with variable magnetisation. In fact, it is known that the blocking temperature of the antiferromagnetic layers diminishes with the thickness thereof, and that it is necessary to attain said blocking temperature to write the storage layer (J. Appl. Phys. 83, 7216 (1998)). The stabilisation layer within the scope of this embodiment thus makes it possible to use a thinner antiferromagnetic layer, writeable at lower temperatures, consequently bringing about energy savings during writing phases.

As has been seen with reference to FIG. 2, only the largest grains contribute to the exchange field. It is known that the energy of interaction is dependent on the surface area of the grains: the greater this surface area, the lower the energy of interaction, and vice versa (J. Appl. Phys. 83, 6888 (1998)). In this particular case, by reducing the energy of interaction via the use of the stabilisation layer 7, the smallest grains of the antiferromagnetic layer also see themselves stabilised.

The stabilisation layer 7 moreover makes it possible to reinforce the magnetic coherence of the first antiferromagnetic layer 6, and it makes it possible to increase the trapping of the direction of magnetisation of the storage layer 5 by the first antiferromagnetic layer 6.

In the absence of stabilisation layer, two adjacent grains of the first antiferromagnetic layer 6 are very weakly coupled magnetically, which means that the magnetic coherence of the first antiferromagnetic layer 6 is low. In other words, the coupling energy $A_{AF/AF}$ between two grains of the first antiferromagnetic layer in the absence of the stabilisation layer is very low.

In this document, "coupling energy" between two grain joints designates the coupling energy per surface unit. Said energy is expressed in $erg/cm^2$.

Within the stabilisation layer 7, which is ferromagnetic, the grains are very strongly coupled. Thus, the coupling energy $A_{F/F}$ between two adjacent grains of the stabilisation layer is around $10^4$ to $10^5$ times stronger than the coupling energy $A_{AF/AF}$ between two grains of the first antiferromagnetic layer in the absence of the stabilisation layer.

Thus, to increase the coupling between the grains of the first antiferromagnetic layer 6, the invention proposes adding a ferromagnetic stabilisation layer 7 on the first antiferromagnetic layer 6.

Figure 5:
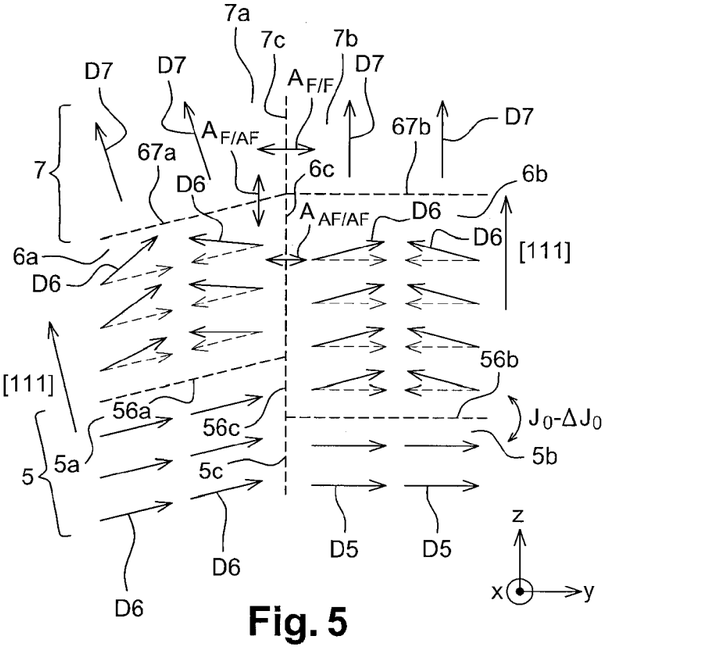
FIG. 5 represents a schematic sectional view of the interface between the first antiferromagnetic layer of the device of FIG. 3 and the stabilisation layer on the one hand and the storage layer on the other hand.

As may be seen schematically in FIG. 5, each grain of the stabilisation layer, for example 7a, is magnetically coupled with the grain 6a of the first antiferromagnetic layer 6 above which it is found. Consequently, the grains of the first antiferromagnetic layer 6 are coupled together through the intermediary of the interfacial coupling between the grains of the stabilisation layer and the first antiferromagnetic layer and the inter-grain coupling between the grains of the stabilisation layer.

The presence of the ferromagnetic stabilisation layer thus enables the existence of an effective coupling between the grains of the first antiferromagnetic layer. Said coupling makes it possible to ensure that grains of the first antiferromagnetic layer, which would be magnetically unstable without the stabilisation layer, become magnetically stable in the presence of the stabilisation layer on account of the appearance of the inter-grain coupling induced by the stabilisation layer. This particularly relates to the grains at the edge of the device, the size of which has been able to be considerably reduced during the process of etching of the device.

Figure 7:
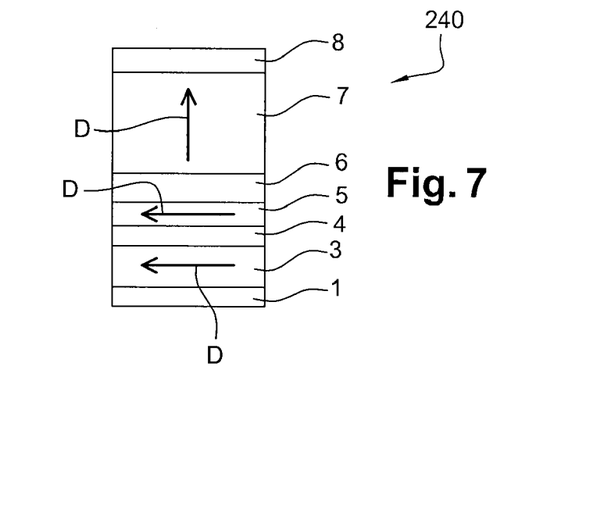
FIG. 7 represents a sectional view of a magnetic device according to a second embodiment of the invention.

FIG. 7 represents a sectional view of a magnetic device 240 according to a second embodiment of the invention.

The device 240 is virtually identical to the device 24 of FIG. 3, the only difference residing in the fact that the device 240 comprises a reference layer 3, the direction of magnetisation of which is not fixed by an antiferromagnetic layer. The reference layer 3 has a variable direction of magnetisation. Said reference layer 3 may be a monolayer or a multilayer.

The magnetic device of FIG. 7 also comprises a storage layer 5, the direction of magnetisation of which is variable. The storage layer 5 may be a monolayer or a multilayer.

The reference layer 3 and the storage layer 5 are separated by a spacer 4.

The magnetic device 240 moreover comprises, in contact with the first antiferromagnetic layer 6, a stabilisation layer 7 made of a ferromagnetic material. Said stabilisation layer 7 has a strong uniaxial anisotropy out of the plane of the stabilisation layer 7 and orthogonal to the direction of magnetisation of the storage layer 5. Moreover, the magnetic device may also comprise a buffer layer 1 and a cover layer 8 on either side of the device.

Figure 8:
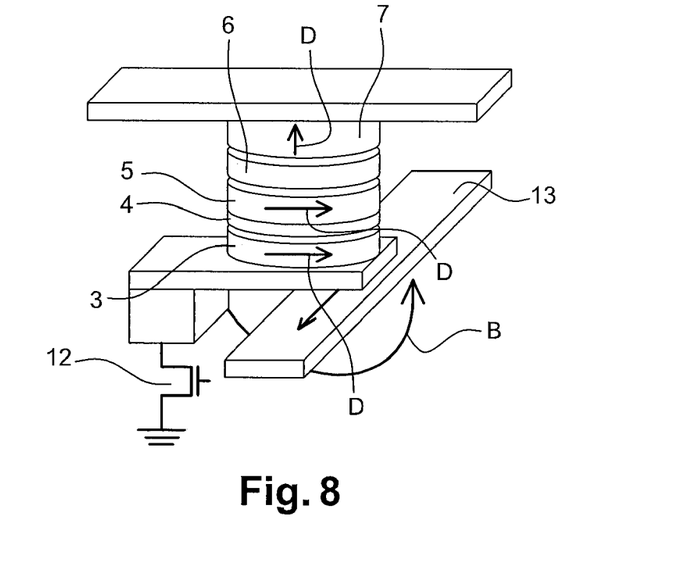
FIG. 8 represents a sectional view of the device of FIG. 7 during the writing of information in the storage layer.

FIG. 8 represents a sectional view of the device of FIG. 7 during the writing of information in the storage layer.

To enable the writing of information in the storage layer, the magnetic device comprises a transistor 12, which is conductor in writing mode. Moreover, the magnetic device comprises a conducting line 13 situated below the magnetic stack. The first conductor 13 is laid out in such a way that, when an electric current passes through it, it creates a magnetic field that is parallel or antiparallel to the direction of magnetisation of the stabilisation layer. At writing, the transistor 12 is in passing mode such that a current can flow through the stack causing a heating of the storage layer and of the first antiferromagnetic layer by Joule effect. Said heating attains a temperature greater than or equal to the blocking temperature of the first antiferromagnetic layer. Thanks to the invention, said blocking temperature is less than the blocking temperature of said same antiferromagnetic layer in the absence of the stabilisation layer 7.

To write information in the storage layer, a current is sent through the conductor 13 and through the stack, the transistor 12 being in passing mode. The stack then heats up to a temperature greater than the blocking temperature of the first antiferromagnetic layer 6, such that the first antiferromagnetic layer 6 becomes paramagnetic and the direction of magnetisation of the storage layer 5 is no longer trapped.

Simultaneously, a magnetic field B is created by the first conductor 13. Said magnetic field has no impact on the stabilisation layer 7, which has a strong anisotropy perpendicular to the plane of the layer thereof.

The field B makes it possible to place the magnetisation of the storage layer in the desired direction.

Once the direction of magnetisation of the storage layer 5 has been placed in the desired direction, the current that is flowing through the stack is cut to enable the stack to cool in the presence of the magnetic field then the current in the conductor 13 is cut to eliminate the applied field. The first antiferromagnetic layer 6 having again become antiferromagnetic, it traps the direction of magnetisation of the storage layer 5 in the direction in which it is found.

It should be noted that during said writing, the reference layer also switches in the direction of the local field created by the conductor 13 and partially radiated by the other magnetic layers but this has no importance since the magnetisation of said layer is then going to be re-oriented in a predetermined direction at the moment of reading.

Then, to read the information contained in the storage layer 5, it is possible to carry out a differential reading thanks to the reference layer 3. To do this, one compares the level of resistance of the junction tunnel formed by the magnetic device for two different orientations of the direction of magnetisation of the reference layer 3. To do this, one orients, with a first pulse of magnetic field produced by a first pulse of current in the conductor 13, the direction of magnetisation of the reference layer 3 in a first predetermined direction. Said orientation of the direction of magnetisation of the reference layer 3 takes place without making current flow through the stack so as not to heat it and thus not to modify the direction of the magnetisation of the storage layer 5. The resistance of the magnetic device is then measured by means of a reading current that is lower, typically divided by a factor of 2, than the heating current used at the time of writing. A second pulse of magnetic field generated by a second pulse of current is then applied in the conductor 13 opposite to the first pulse, still without heating, so as to orientate the direction of magnetisation of the reference layer 3 in the sense opposite to the first predetermined sense. The resistance of the magnetic device is then again measured. After each current pulse, the direction of magnetisation of the reference layer 3 is known, since the direction of the pulses of the applied magnetic fields is known. Consequently, by comparing the resistance of the magnetic device after the first current pulse and after the second current pulse, the direction of magnetisation of the storage layer 5 is deduced therefrom, and thus the information contained in the storage layer 5.

As illustrated in FIG. 3, the invention applies as much with a reference layer, the direction of magnetisation of which is trapped.

To write information in the storage layer, the reference layer can then be used. To do this, it is possible to apply for example a magnetic field exterior to the magnetic device as has been described in relation with FIG. 8. But it is also possible to write by making a current of electrons flow through the layers of the magnetic device, perpendicularly to the layers, in one direction or the other, in other words from bottom to top or from top to bottom depending on whether it is wished to make the magnetisation of the storage layer parallel or antiparallel to that of the reference layer. Said current has a double effect. Firstly, independently of the sense of direction thereof, it causes by Joule effect at the level of the tunnel barrier a heating of the structure above the blocking temperature of the antiferromagnetic layer. This has the effect of freeing the magnetisation of the storage layer which is no longer trapped through interaction with the antiferromagnetic layer. Furthermore, when said flow of electrons passes through the reference layer, which is magnetic, the spins of the electrons are going to be spin polarised, such that the electrons will come out of said reference layer with a polarised spin. When said electrons pass through the storage layer, they are going to undergo exchange interactions with the spins responsible for the magnetisation of the storage layer. If the current density is sufficiently high, this is going to cause a reorientation of the magnetisation of said layer and an alignment of the magnetisation of the storage layer by transfer of the angular moment of the polarised electrons with the magnetic moment of the storage layer. This phenomenon is known under the name of spin transfer. Thus, if the current of electrons flows from the reference layer to the storage layer, the spin transfer is going to favour the parallel orientation of the magnetisations of the storage and reference layers. On the other hand, if the current of electrons flows from the storage layer to the reference layer, it is the antiparallel alignment that is favoured. In said writing mode, the spin transfer is exerted above all on the magnetisation of the storage layer.

In reading mode, a flow of electrons is sent through the layers and the resistance of the magnetic device is measured. Said reading current is of lower intensity than the writing current (typically at least 50%) so as not to risk perturbing by spin transfer the magnetic orientation of the storage layer at the moment of reading. The measured resistance is then compared with a standard reference value. If the measured resistance is greater than said standard reference value, it is deduced from this that the storage layer has a direction of magnetisation antiparallel to that of the reference layer. If the measured resistance is less than said standard reference value, it is deduced from this that the storage layers and reference layers have parallel directions of magnetisations.

Naturally, the invention is not limited to the embodiments described with reference to the figures and variants may be envisaged without going beyond the scope of the invention. In particular, the materials and the thicknesses chosen to form the buffer layers, the reference layers, the storage layers and the spacers are only given here by way of illustration and other materials or thicknesses could be used.

Even through the described embodiments of the device according to the invention are more specifically intended to be implemented in magnetic memories with thermally assisted writing, it is understood that the device according to the invention may be implemented in other magnetic devices such as magnetic field sensors or reading heads for magnetic recording support from the moment that these devices require the use of an antiferromagnetic layer for trapping the magnetisation of a free layer.

In all of the embodiments described with reference to the figures, the magnetic storage layers (free layers) have a direction of magnetisation in the plane, in other words the magnetisation of the magnetic free layer is parallel or antiparallel to the plane in which the free layer is found whereas the magnetic stabilisation layers have an out of plane magnetisation, in other words the magnetisation of the magnetic stabilisation layer is perpendicular to the plane in which is found the magnetic stabilisation layer. However, the magnetic device according to the invention could also be produced with out of plane magnetisations for the free layers and in the plane for the stabilisation layers. In this case, the direction of the magnetic field making it possible to switch the magnetisation of the free layer must obviously be perpendicular to the plane of the layers.

The invention claimed is:

1. A magnetic device comprising:
   a magnetic layer having a variable direction of magnetisation;
   a first antiferromagnetic layer in contact with said magnetic layer, said first antiferromagnetic layer being able to trap the direction of magnetisation of said magnetic layer;
   a ferromagnetic layer, said ferromagnetic layer being in contact with said first antiferromagnetic layer by a face thereof opposite to said magnetic layer, the directions of magnetisation of said magnetic and ferromagnetic layers being substantially perpendicular, a first layer among said magnetic and ferromagnetic layers having a magnetisation, a direction of which is oriented along a plane of said first layer and a second of the two layers among said magnetic and ferromagnetic layers has a magnetisation, a direction of which is oriented outside of a plane of said second layer.

2. The magnetic device according to claim 1, wherein said ferromagnetic layer has a direction of magnetisation oriented outside of the plane of said ferromagnetic layer and said magnetic layer has a direction of magnetisation in the plane of said magnetic layer.

3. The magnetic device according to claim 2, wherein said ferromagnetic layer is formed according to one of the following lay outs or materials:
   a multilayer of period (Pt/Co), (Pd/Co), (Co/Ni) or (Co/Pt/Cr/X), X being Ta or P;
   an ordered alloy of FePt or FePd;
   an alloy of CoPt or CoPd;
   a rare earth/transition metal alloy.

4. The magnetic device according to claim 1, wherein a thickness of said first antiferromagnetic layer is comprised between 3 and 5 nm.

5. The magnetic device according to claim 1, wherein said magnetic layer comprises at least one stack formed of:
   a transition layer constituted of a ferromagnetic material having a centred-face cubic crystallographic structure in contact with the first antiferromagnetic layer;
   an amorphous or quasi-amorphous layer in contact with said transition layer;
   a ferromagnetic layer.

6. The magnetic device according to claim 1, wherein said magnetic layer is constituted of a synthetic three layer antiferromagnetic stack comprising a first and a second magnetic layer separated by a non-magnetic conducting layer.

7. The magnetic device according to claim 1, having a shape anisotropy in the plane thereof.

8. The magnetic device according to claim 1 wherein said device is a magnetic device with thermally assisted writing comprising:
   a reference magnetic layer, said magnetic layer being a storage layer;
   a spacer situated between said reference magnetic layer and said storage layer.

9. The magnetic device according to claim 8, wherein said reference magnetic layer has a direction of magnetisation trapped by a second antiferromagnetic layer laid out in contact with the reference magnetic layer.

10. The magnetic device according to claim 8, wherein the reference magnetic layer has a variable direction of magnetisation.

11. A magnetic storage with thermally assisted writing in which each memory cell comprises a magnetic device according to claim 8.

* * * * *